(12) United States Patent
Yasui et al.

(10) Patent No.: US 7,715,661 B2
(45) Date of Patent: May 11, 2010

(54) SOLID-STATE IMAGE PICKUP DEVICE, METHOD OF DRIVING SOLID-STATE IMAGE PICKUP DEVICE AND IMAGING APPARATUS

(75) Inventors: Yukihiro Yasui, Kanagawa (JP); Yoshinori Muramatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 963 days.

(21) Appl. No.: 11/459,110

(22) Filed: Jul. 21, 2006

(65) Prior Publication Data

US 2007/0023788 A1    Feb. 1, 2007

(30) Foreign Application Priority Data

Jul. 29, 2005    (JP)    ............................ P2005-219844

(51) Int. Cl.
*G06K 7/00* (2006.01)
*H04N 3/14* (2006.01)

(52) U.S. Cl. ........................................ 382/312; 348/294
(58) Field of Classification Search ................. 382/218, 382/312, 145, 151, 221, 254, 305, 308; 348/294–299, 348/307–308; 341/122, 133; 257/202, 239
See application file for complete search history.

(56) References Cited

U.S. PATENT DOCUMENTS

| | | | | |
|---|---|---|---|---|
| 3,968,430 | A * | 7/1976 | Maas | 600/521 |
| 7,218,260 | B2 * | 5/2007 | Lim | 341/122 |
| 7,339,672 | B2 * | 3/2008 | Hashiguchi et al. | 356/394 |
| 7,349,119 | B2 * | 3/2008 | Tsukioka | 358/1.18 |
| 7,554,584 | B2 * | 6/2009 | Lim | 348/241 |
| 7,564,398 | B2 * | 7/2009 | Muramatsu et al. | 341/168 |
| 2006/0007338 | A1 * | 1/2006 | Wakano et al. | 348/308 |

FOREIGN PATENT DOCUMENTS

| | | |
|---|---|---|
| JP | 2000-287131 | 10/2000 |
| JP | 2001-223566 | 8/2001 |
| JP | 2002-232291 | 8/2002 |
| JP | 2004-248304 | 9/2004 |
| JP | 2004-304413 | 10/2004 |
| JP | 2004-312700 | 11/2004 |

OTHER PUBLICATIONS

Japanese Patent Office Action corresponding to Japanese Serial No. 2005-219844 dated Oct. 27, 2009.

* cited by examiner

*Primary Examiner*—Kanji Patel
(74) *Attorney, Agent, or Firm*—Sonnenschein Nath & Rosenthal LLP

(57) ABSTRACT

There is provided a solid-state image pickup device including: a pixel array portion which includes a plurality of unit pixels each having a photoelectric conversion element and an output transistor for outputting a signal according to charge obtained by photoelectric conversion of the photoelectric conversion element; a comparing portion which compares the signal output from each of the unit pixels with a ramp-shaped reference signal; a measuring portion which starts an operation in synchronization with the supply of the reference signal to the comparing portion, performs the operation until the comparison output of the comparing portion is inverted, and measures a time until the comparison of the comparing portion is finished; and a detecting portion which detects a predetermined image pickup condition and fixes the comparison output of the comparing portion to a state before the comparison starts when the image pickup condition is detected.

7 Claims, 15 Drawing Sheets

SOLID-STATE IMAGE PICKUP DEVICE, METHOD OF DRIVING SOLID-STATE IMAGE PICKUP DEVICE AND IMAGING APPARATUS

CROSS REFERENCES TO RELATED APPLICATIONS

The present invention contains subject matter related to Japanese Patent Application JP 2005-219844 filed in the Japanese Patent Office on Jul. 29, 2005, the entire contents of which being incorporated herein by reference.

BACKGROUND OF THE INVENTION

1. Field of the Invention

The present invention relates to a solid-state image pickup device, a method of driving the solid-state image pickup device and an imaging apparatus.

2. Description of the Related Art

A solid-state image pickup device such as a charge coupled device (CCD) type image sensor or a complementary metal oxide semiconductor (CMOS) type image sensor has been widely used as an imaging pickup device mounted in a mobile terminal such as a mobile telephone, the device being formed as one chip or as a module, or an image input device (image pickup device) of an imaging apparatus such as a digital still camera or a digital video camera.

FIG. 1 is a circuit diagram showing the configuration example of a pixel portion of a general solid-state image pickup device. As shown in FIG. 1, a unit pixel 100 according to the present example includes a photoelectric converting element such as a photodiode 101 and four transistors including a transport transistor 102, a reset transistor 103, an amplifying transistor 104 and a selection transistor 105. These transistors 102 to 105 are, for example, n-channel type MOS transistors.

The transport transistor 102 is connected between the cathode electrode of the photodiode 101 and a floating diffusion (FD) portion 106 and the gate electrode of the transport transistor 102 is connected to a transport control line 111 supplied with a transport gate pulse TG. The drain electrode of the reset transistor 103 is connected to a power source Vdd, the source electrode thereof is connected to the FD portion 106, and the gate electrode thereof is connected to a reset control line 112 supplied a reset pulse RS.

The gate electrode of the amplifying transistor 104 is connected to the FD portion 106 and the source electrode thereof is connected to a signal line 121 in a source follower circuit configuration. One end of the signal line 121 is connected to a constant current source 122. The drain electrode of the selection transistor 105 is connected to the power source Vdd, the source electrode thereof is connected to the drain electrode of the amplifying transistor 104 and the gate electrode thereof is connected to a selection control line 113 supplied with a selection pulse SEL.

FIG. 2 is a cross-sectional view showing a cross-sectional structure of a pixel portion except the amplifying transistor 104 and the selection transistor 105.

N-type diffusion regions 132, 133 and 134 are formed in the surface layer of a p-type substrate 131. On the p-type substrate 131, a gate electrode 135 is formed between then-type diffusion region 132 and the n-type diffusion region 133 and a gate electrode 136 is formed between the n-type diffusion region 133 and the n-type diffusion region 134 through a gate oxide film ($SiO_2$) (not shown).

In the correspondence between FIG. 1 and FIG. 2, the photodiode 101 is formed by the pn junction between the p-type substrate 131 and the n-type diffusion region 132. The transport transistor 102 is formed by the n-type diffusion region 132, the n-type diffusion region 133, and the gate electrode 135 interposed therebetween. The reset transistor 103 is formed by the n-type diffusion region 133, the n-type diffusion region 134 and the gate electrode 136 interposed therebetween.

The n-type diffusion region 133 becomes the FD portion 106 and is electrically connected to the gate electrode of the amplifying transistor 104. The power source potential Vdd is applied to the n-type diffusion region 134 which becomes the drain region of the reset transistor 103. The upper surface of the p-type substrate 131 except the photodiode 101 is covered with a light shielding layer 137.

Next, based on the cross-sectional view of FIG. 2, the circuit operation of the pixel 100 will be described with reference to the waveform diagram of FIG. 3.

As shown in FIG. 2, when light is irradiated to the photodiode 101, a pair of electron (−) and hole (+1) is induced depending on the intensity of the light (photoelectric conversion). In FIG. 3, the selection pulse SEL is applied to the gate electrode of the selection transistor 105 at a time T1 and at the same time the reset pulse RS is applied to the gate electrode of the reset transistor 103. As a result, the reset transistor 103 falls into a conductive state and the FD portion 106 is reset to the power source potential Vdd at a time T2.

When the FD portion 106 is reset, the potential of the FD portion 106 is output to the signal line 121 through the amplifying transistor 104 as a reset level Vn. This reset revel corresponds to an inherent noise component of the pixel 100. The reset pulse RS is in an active ("H" level) state only during a predetermined period (time T1 to T3). The FD portion 106 is maintained in a reset state even after the reset pulse RS transitions from the active state to an inactive ("L" level) state. The period when the FD portion 106 is in the reset state is referred to as a reset period.

Next, in a state that the selection signal SEL is in the active state, the transport gate pulse TG is applied to the gate electrode of the transport transistor 102 at a time T4. Then, the transport transistor 102 falls into the conductive state, and signal charge which is photoelectrically converted and stored in the photodiode 101 is transmitted to the FD portion 106. As a result, the potential of the FD portion 106 varies depending on the amount of the signal charge (time T4 to T5). The potential of the FD portion 106 at this time is output to the signal line 121 through the amplifying transistor 104 as a signal level Vs (signal read period). The difference RSI1 between the signal level Vs and the reset level Vn becomes an inherent pixel signal level without the noise component.

In general, when the image of a bright subject is picked up, the amount of the charge stored in the photodiode 101 in the reset period is larger than that of when the image of a dark subject is picked up. Thus, the level difference RSI1 on the signal line 121 increases.

(Generation Mechanism of Blackening Phenomenon)

However, the solid-state image pickup device configured above, particularly, when significantly strong light such as solar light enters the pixel 100, a phenomenon in which a brightest portion blackens, that is, a blackening phenomenon, occurs.

The generation mechanism of the blackening phenomenon will be described with reference to FIGS. 4 and 5. FIG. 4 is a schematic diagram showing a portion for generating the blackening phenomenon and has the substantially same structure as FIG. 2. FIG. 5 is a waveform diagram at the time of the blackening phenomenon.

In the reset period, similar to that of FIG. 2, the selection pulse SEL is applied to the gate electrode of the selection transistor 105 at a time T1' and at the same time the reset pulse RS is applied to the gate electrode of the reset transistor 103. As a result, the reset transistor 103 falls into a conductive state and the FD portion 106 is reset to the power source potential Vdd at a time T2'. The potential of the FD portion 106 at the time of the reset is output to the signal line 121 through the amplifying transistor 104 as the reset level Vn.

However, as shown in FIG. 4, when significantly strong light such as solar light is irradiated to the photodiode 101, a large amount of pairs of electron (−) and hole (+) is induced in the pn junction formed by the p-type substrate 131 and the n-type diffusion region 132 compared with FIG. 2. As a result, excessive photoelectric-converted electrons flow out of the photodiode 101. Thus, even if the transport gate pulse is in the inactive state, the excessive electrons pass through the transport transistor 102 and reach the FD portion 106. Accordingly, the potential of the FD portion 106 decreases and, as a result, the potential of the signal line 121 decreases (time T2' to T4').

Similarly, in the signal read period, in a state that the selection signal SEL is in the active state, when the transport gate pulse TG is applied to the gate electrode of the transport transistor 102 at the time T4', the transport transistor 102 falls into the conductive state and signal charge which is photoelectrically converted and stored in the photodiode 101 is transmitted to the FD portion 106. As a result, the potential of the FD portion 106 varies depending on the amount of the signal charge (time T4' to T5'). The potential of the FD portion 106 at this time is output to the signal line 121 through the amplifying transistor 104 as the signal level Vs.

At this time, since the excessive electrons leak in the reset period, as can be seen from FIG. 5, the potential of the signal line 121 decreases compared with when applying the reset pulse RS. As a result, even if strong light is irradiated, the potential difference RSI2 in the signal read period decreases.

That is, as shown in FIG. 6, in general, the difference Vs−Vn between the signal level Vs of the signal read period and the reset level Vn of the reset period is output as the inherent pixel signal level, and, when incident light amount exceeds predetermined light amount B, the signal level Vs is saturated and a constant pixel signal level is output. When the incident light amount exceeds predetermined light amount C larger than the light amount B, the excessive electrons flow out of the photodiode 101 and thus the reset level Vn varies as described above. As a result, even if strong light is irradiated, the difference Vs−Vn decreases. Accordingly, in spite of a significantly bright subject, the blackening phenomenon occurs.

In order to avoid such a blackening phenomenon, there was provided a technology for detecting whether incident light is significantly strong or not depending on whether a signal level Vs is in a saturation area or a reset level Vn is in a varying area and correcting a process for obtaining a difference Vs−Vn based on the detected result (for example, see Patent Document 1).

Patent Document 1: JP-A-2004-248304

More specifically, as shown in FIG. 7, a switch 206 is provided in the signal line of a reset level Vn between an amplifier 204 for amplifying the reset level Vn and a signal level Vs which are respectively output from a pixel array portion 201 through an N memory 202 and S memory 203 and a differential amplifier 205 for obtaining the difference between the signal level Vs and the reset level Vn. When it is detected that the signal level Vs is equal to or larger than a predetermined level Va or the reset level Vn is a predetermined level Vb in a light level detection circuit 207, the switch 206 is turned off (opening) to stop the process for obtaining the difference in the differential amplifier 205 and a signal before the A/D conversion of an A/D conversion circuit 208 is corrected, thereby avoiding the blackening phenomenon.

Alternatively, as shown in FIG. 8, even if it is detected that the signal level Vs is equal to or larger than the predetermined level Va or the reset level Vn is the predetermined level Vb in the light level detection circuit 207, the process for obtaining the difference in the differential amplifier 205 is performed, the difference is converted into a digital signal in the A/D conversion circuit 208 and stored in a memory 209. At the time of detecting the above-described state by the light level detection circuit 207, when the difference signal is read from a memory 209, the difference signal is converted into a signal having a predetermined level (signal level Va) by a conversion circuit 210 or the digital data of the A/D conversion circuit 209 is converted into saturation data by the saturation detection signal of the light level detection circuit 207, thereby avoiding the blackening phenomenon.

However, in the former technology, in order to correct the signal before the A/D conversion of the A/D conversion circuit 208, a circuit for a correction signal such as a constant voltage circuit is necessary in addition to the light level detection circuit 207 and thus the size of the circuit increases as a circuit for avoiding the blackening phenomenon.

In the latter technology, in order to correct the value of the memory 209, since the conversion circuit 210 for inserting a correction signal into the memory 209 is necessary in addition to the light level detection circuit 207 and thus the size of the circuit increases as a circuit for avoiding the blackening phenomenon.

SUMMARY OF THE INVENTION

Accordingly, there is a need for providing a solid-state image pickup device and a method of driving the solid-state image pickup device which can avoid a blackening phenomenon while reducing the size of a circuit.

According to an embodiment of the present invention, there is provided a solid-state image pickup device including: a pixel array portion which includes a plurality of unit pixels each having a photoelectric conversion element and an output transistor for outputting a signal according to charge obtained by photoelectric conversion of the photoelectric conversion element; a comparing portion which compares the signal output from each of the unit pixels with a ramp-shaped reference signal; a measuring portion which starts an operation in synchronization with the supply of the reference signal to the comparing portion, performs the operation until the comparison output of the comparing portion is inverted, and measures a time until the comparison of the comparing portion is finished; and a detecting portion which detects a predetermined image pickup condition and fixes the comparison output of the comparing portion to a state before the comparison starts when the image pickup condition is detected.

According to another embodiment of the present invention, there is provided a method of driving a solid-state image pickup device including a pixel array portion which includes a plurality of unit pixels each having a photoelectric conversion element and an output transistor for outputting a signal according to charge obtained by photoelectric conversion of the photoelectric conversion element, a comparing portion which compares the signal output from each of the unit pixels with a ramp-shaped reference signal, and a measuring portion which starts an operation in synchronization with the supply of the reference signal to the comparing portion, performs the operation until the comparison output of the comparing portion is inverted, and measures a time until the comparison of the comparing portion is finished, the method including the steps of detecting a predetermined image pickup condition; and fixing the comparison output of the comparing portion to a state before the comparison starts when the image pickup condition is detected.

According to another embodiment of the present invention, there is provided a solid-state image pickup device including: a pixel array portion in which unit pixels each having a photoelectric conversion element and an output transistor for outputting a signal according to charge obtained by photoelectric conversion of the photoelectric conversion element are two-dimensionally arranged in a matrix; and analog-digital converting portions which are arranged in the matrix-shaped the unit pixel array for each column and converts an analog signal output from each of the unit pixel into a digital signal, wherein each of the analog-digital converting portions includes a comparing portion which compares the signal output from each of the unit pixels with a ramp-shaped reference signal, a measuring portion which starts an operation in synchronization with the supply of the reference signal to the comparing portion, performs the operation until the comparison output of the comparing portion is inverted, measures a time until the comparison of the comparing portion is finished, and converts the measured result into the digital signal, and a detecting portion which detects a predetermined image pickup condition in which a reset level output from each of the unit pixels is equal to or less than a predetermined reference level when the unit pixel is reset and fixes the comparison output of the comparing portion to a state before the comparison starts when the image pickup condition is detected.

According to another embodiment of the present invention, there is provided an imaging apparatus including: a solid-state image pickup device; an optical system which forms image light from a subject on an image pickup surface of the solid-state image pickup device, wherein the solid-state image pickup device includes a pixel array portion which includes a plurality of unit pixels each having a photoelectric conversion element and an output transistor for outputting a signal according to charge obtained by photoelectric conversion of the photoelectric conversion element, a comparing portion which compares the signal output from each of the unit pixels with a ramp-shaped reference signal, a measuring portion which starts an operation in synchronization with the supply of the reference signal to the comparing portion, performs the operation until the comparison output of the comparing portion is inverted, and measures a time until the comparison of the comparing portion is finished, and a detecting portion which detects a predetermined image condition and fixes the comparison output of the comparing portion to a state before the comparison starts when the image pickup condition is detected.

DETAILED DESCRIPTION OF THE INVENTION

Hereinafter, embodiments of the present invention will be described in detail with reference to the accompanying drawings.

Figure 9:
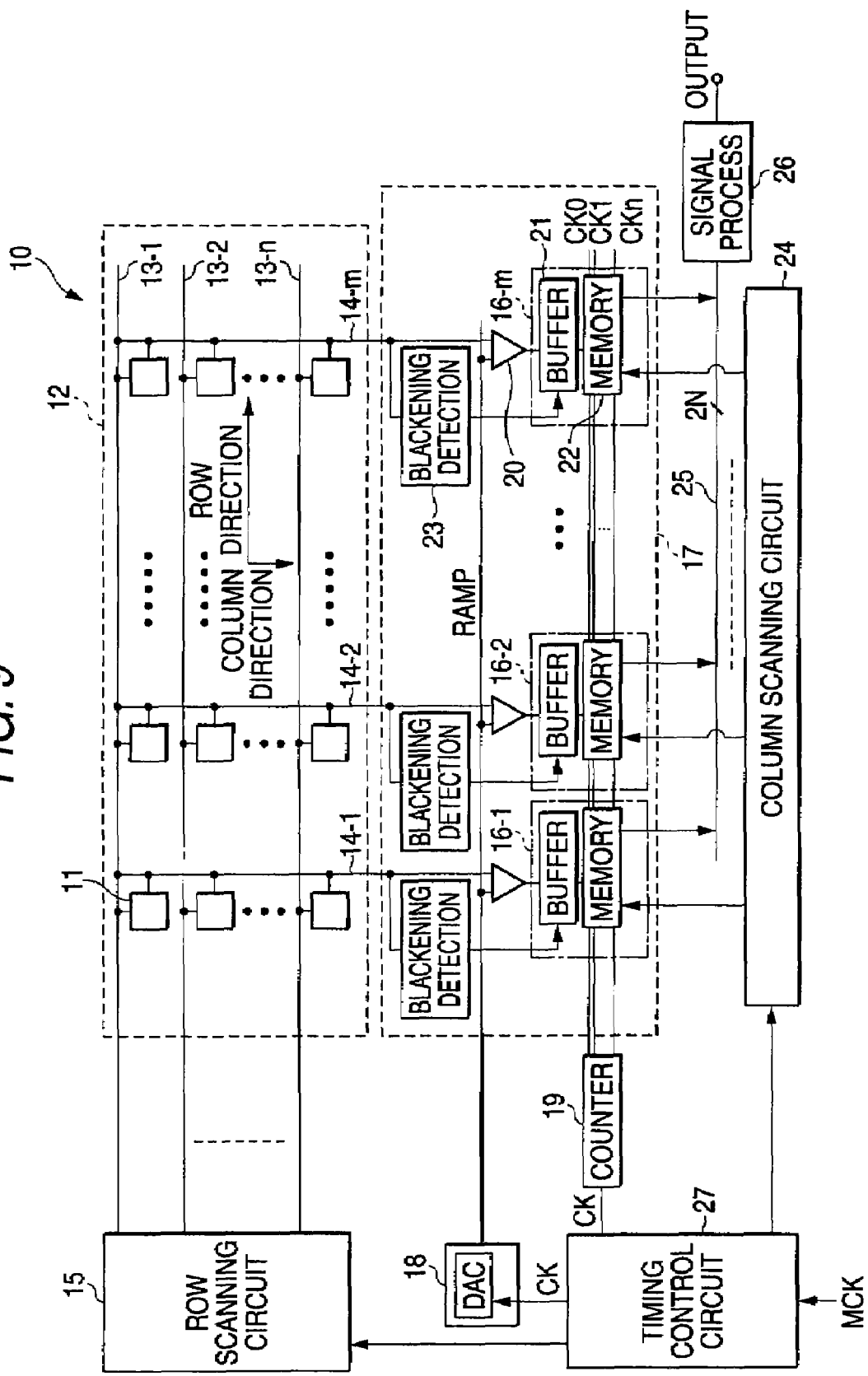
FIG. 9 is a block diagram showing the configuration of a solid-state image pickup device having a column-parallel ADC mounted thereon, according to an embodiment of the present invention.

FIG. 9 is a block diagram showing the configuration of a solid-state image pickup device according to an embodiment of the present invention, for example, a solid-state image pickup device (for example, a CMOS image sensor) having a column-parallel ADC mounted thereon, in which an analog-digital converter (hereinafter, abbreviated an ADC) is arranged for each column with respect to a matrix-shaped pixel array.

Figure 1:
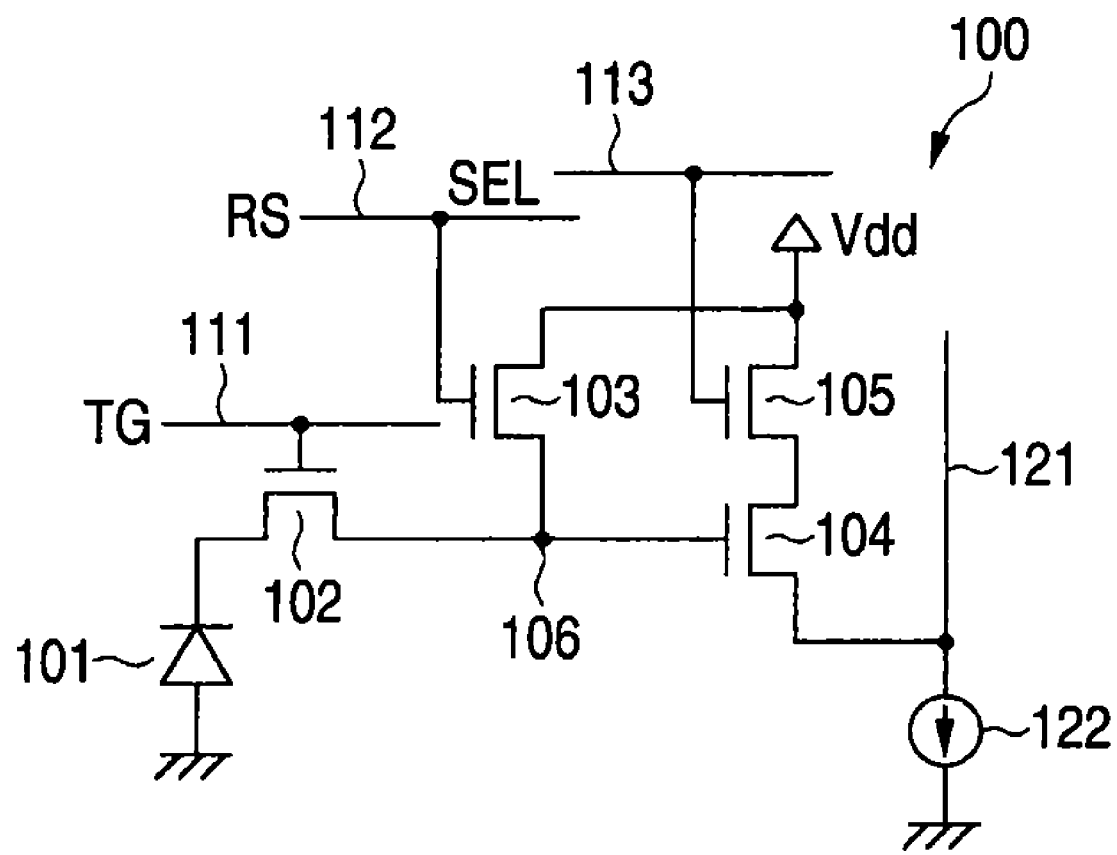
FIG. 1 is a circuit diagram showing the configuration example of a general solid-state image pickup device.

In FIG. 9, a unit pixel 11 includes a photoelectric conversion element such as a photodiode and a pixel transistor (inside-of-pixel amplifying transistor) and the unit pixels 11 are two-dimensionally arranged in a matrix (n×m) to configure a pixel array portion 12. The unit pixel 11 may, for example, include the four transistors shown in FIG. 1. However, the unit pixel of the present invention is not limited to the four transistors.

In the n×m pixel array of the pixel array portion 12, a row control line 13 (13-1 to 13-n) is arranged for each row and a column signal line 14 (14-1 to 14-m) is arranged for each column. The control of the row address or the row scan of the pixel array portion 12 is performed by a row scanning circuit 15 through the row control lines 13-1 to 13-n. One ends of the column signal lines 14-1 to 14-m are provided with ADCs 16-1 to 16-m to configure a column processing portion (column-parallel ADC block) 17.

A portion for generating a ramp-shaped reference voltage RAMP which varies over time, for example, a digital-analog converter (hereinafter, abbreviated to a DAC) 18 and a counter 19 which is measuring portion for performing a count operation in synchronization with a clock signal CK having a predetermined period and measuring a time for performing a comparison operation in the below-described comparator 20 are commonly provided to the ADCs 16-1 to 16-m. As the counter 19, for example, an up counter is used.

Each of the ADCs 16 includes a comparator 20 for comparing an analog signal obtained from the unit pixel 11 of a selected row through each of the column signal lines 14-1 to 14-m with the reference voltage RAMP which is generated in the DAC 18 and supplied as a reference signal, a buffer circuit 21 for buffering the comparison output of the comparator 20, a memory device 22 for holding the count value of the counter 19 in response to the comparison output of the comparator 20 which passes through the buffer circuit 21, and a portion for detecting a predetermined image pickup condition based on the analog signal from the unit pixel 11, that is, a blackening detection circuit 23 for detecting the image pickup condition for generating a blackening phenomenon in which the reset level output from the unit pixel 11 is equal to or less than a predetermined reference level when the unit pixel 11 is reset, for each of the row control lines 13-1 to 13-n, and has a function for converting the analog signal from the unit pixel 11 into an N-bit digital signal.

The control of the column address or the column scan of each of the ADCs 16 of the column processing portion 17 is performed by the column scanning circuit 24. That is, the N-bit digital signal which is AD-converted in each of the ADCs 16 is sequentially read to a horizontal output line 25 having a 2N-bit width by the column scan of the column scanning circuit 24 and transmitted to a signal processing circuit 26 by the horizontal output line 25.

The signal processing circuit 26 includes 2N sense circuits corresponding to the horizontal output line 25 having the 2N-bit width, a subtraction circuit and an output circuit. A timing control circuit 27 generates clock signals CK or timing signals necessary for the operations of the row scanning circuit 15, the ADC 16, the DAC 18, the counter 19 and the column scanning circuit 24 based on a master clock MCK and supplies these clock signals or the timing signals to the circuit portions corresponding thereto.

In the solid-state image pickup device 10 having the column-parallel ADC mounted thereon, peripheral circuits for controlling the drive of the pixels 11 of the pixel array portion 12, that is, the row scanning circuit 15, the column processing portion 17, the DAC 18, the counter 19, the column scanning circuit 24, the signal processing circuit 26 and the timing control circuit 27 are integrated on the same semiconductor chip (substrate) as the pixel array portion 12.

Figure 10:
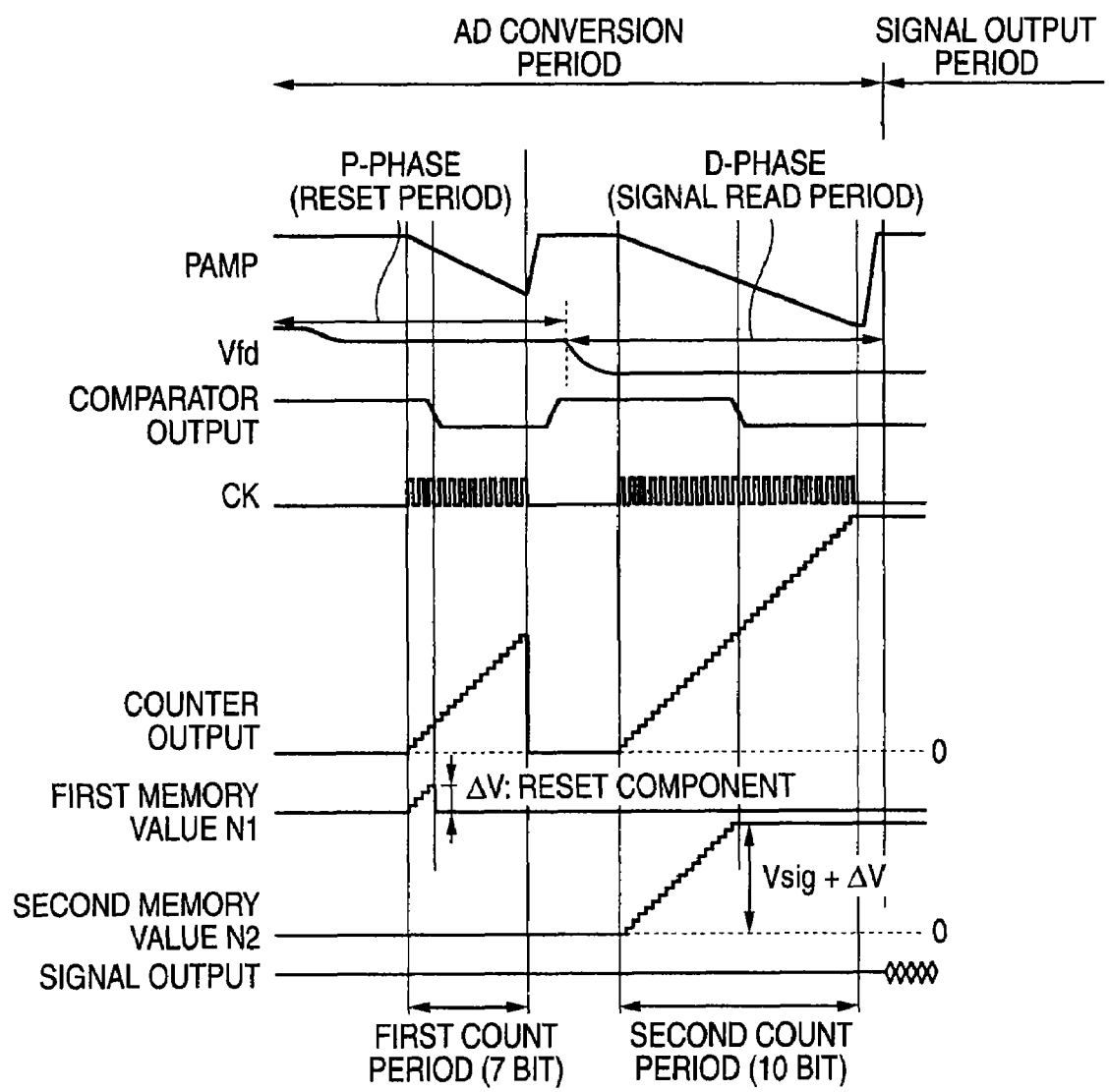
FIG. 10 is a timing chart showing the operation at the time of general image pickup in the solid-state image pickup device having the column-parallel ADC mounted thereon.

Next, the operation at the time of a general image pickup in the solid-state image pickup device 10 having the column-parallel ADC mounted thereon will be described with reference to the timing chart of FIG. 10. FIG. 10 shows the waveform and the timing relationship of the reference voltage RAMP, the potential Vfd of a floating diffusion (FD) portion of the unit pixel 11, the output of the comparator 20, the clock signal Ck, the output (count value) of the counter 19, the first memory value N1 and the second memory value N2 stored in the memory device 22, and the signal output.

After a first read operation from the unit pixels 11 of a selected row to the column signal lines 14-1 to 14-m is stabilized, the reference voltage RAMP is supplied from the DAC 18 to the comparator 20 and the comparison operation between the signal voltage Vx of each of the column signal lines 14-1 to 14-m according to the potential Vfd of the FD portion and the reference voltage RAMP is performed in the comparator 20. At the time of supplying the reference voltage RAMP to the comparator 20, the counter 19 starts a first count operation in synchronization with the clock signal CK. In the comparison operation of the comparator 20, when the reference voltage RAMP and the signal voltage Vx become equal to each other, the output Vco of the comparator 20 is inverted. The memory device 22 maintains the count value N1 of the counter 19 according to the comparison time of the comparator 20 by the inversion of the output Vco of the comparator 20.

In the first read operation, a reset component $\Delta V$ of the unit pixel 11 is read. In the reset component $\Delta V$, irregular fixed-pattern noise is included as offset for each unit pixel 11. However, since the irregularity of the reset component $\Delta V$ is generally small and the reset level commonly exists in all the pixels, the signal voltage Vx of each of the column signal lines 14-1 to 14-m at the time of the first read operation is generally known. Accordingly, at the time of the first read operation of the reset component $\Delta V$, it is possible to shorten the comparison period of the comparator 20 by adjusting the ramp-shaped reference voltage RAMP. In the present example, the comparison of the reset component $\Delta V$ is performed during a 7-bit count period (128 clocks).

In a second read operation, in addition to the reset component $\Delta V$, a signal component according to incident light amount for each unit pixel 11 is read by the same operation as the first read operation. That is, after the second read operation from the unit pixels 11 of a selected row to the column signal lines 14-1 to 14-m is stabilized, the reference voltage RAMP is supplied from the DAC 18 to the comparator 20 and the comparison operation between the signal voltage Vx of each of the column signal lines 14-1 to 14-m and the reference voltage RAMP is performed in the comparator 20.

At the time of supplying the reference voltage RAMP to the comparator 20, the counter 19 starts a second count operation in synchronization with the clock signal CK. In the second comparison operation, when the reference voltage RAMP and the signal voltages Vx become equal to each other, the output Vco of the comparator 20 is inverted. The memory device 22 maintains the count value N2 of the counter 19 according to the comparison time of the comparator 20 by the inversion of the output Vco of the comparator 20. At this time, the first count value N1 and the second count value N2 are maintained in different positions of the memory device 22.

After the above-described AD conversion operation is finished, first and second N-bit digital signals maintained in the memory device 22 are supplied to the signal processing circuit 26 through 2N horizontal output lines 25 by the column scan of the column scanning circuit 112, are subjected to a subtraction process (second signal−first signal) of a subtraction circuit (not shown) in the signal processing circuit 26 and are externally output. Thereafter, the above-described operation is sequentially repeated for each row to generate a two-dimensional image.

Blackening Detection Circuit

In the above-described solid-state image pickup device 10 having the column-parallel ADC mounted thereon, the present invention is characterized in the configuration and the operation of the blackening detection circuit 22 of the column processing portion 17.

FIRST CIRCUIT EXAMPLE

Figure 11:
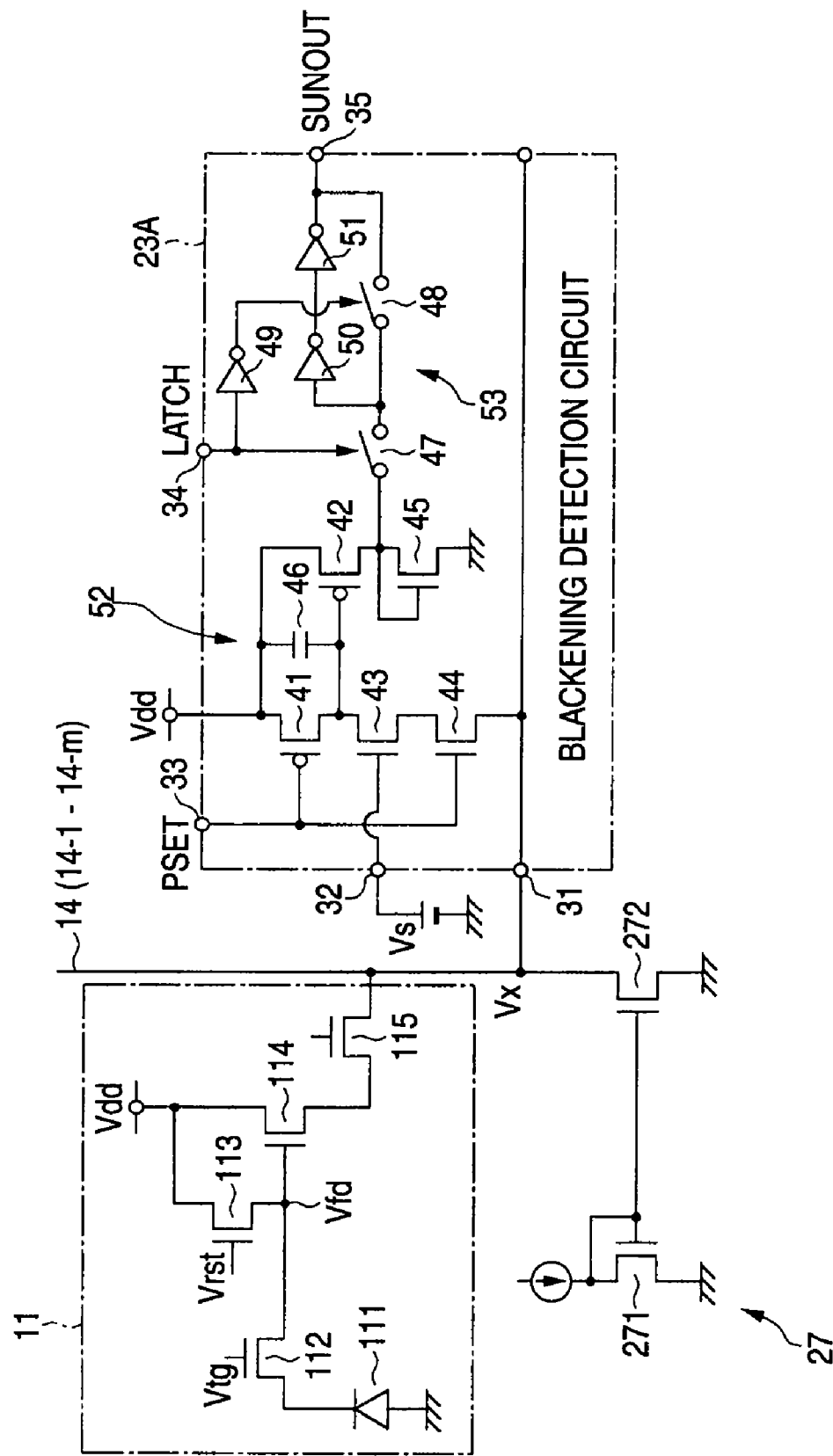
FIG. 11 is a circuit diagram showing the configuration of a blackening detection circuit according to a first circuit example.

FIG. 11 is a circuit diagram showing the configuration of a blackening detection circuit 23A according to a first circuit example. The unit pixel 11 and a constant current source 27 connected to one end of the column signal line 14 (14-1 to 14-m) are shown together.

In FIG. 11, the unit pixel 11 includes a photoelectric conversion element such as a photodiode 111 and four transistors including a transport transistor 112, a reset transistor 113, an amplifying transistor 114 and a selection transistor 115. The basic functions of the transistors of the unit pixel 11 are similar to those of the unit pixel 100 shown in FIG. 1 except the connection position of the selection transistor 115. The configuration of the unit pixel 11 is not limited to the four transistors and only three transistors may be used by allowing the amplifying transistor 114 to perform the function of the selection transistor 115.

The constant current source 27 includes an n-channel type MOS transistor 271 of which the gate electrode and the drain electrode are commonly connected and the source electrode is grounded in a diode connection and an n-channel type MOS transistor 272 of which the gate electrode is commonly connected to the gate electrode of the MOS transistor 271, the drain electrode is connected to one end of the column signal line 14 (14-1 to 14-m) and the source electrode is grounded.

The blackening detection circuit 23A according to the present example has an input terminal 31, control terminals 32 to 34, an output terminal 35, two p-channel type MOS transistors 41 and 42, three n-channel type MOS transistors 43 to 45, a capacitor 46, two switches 47 and 48 and three inverters 49 to 51.

Figure 2:
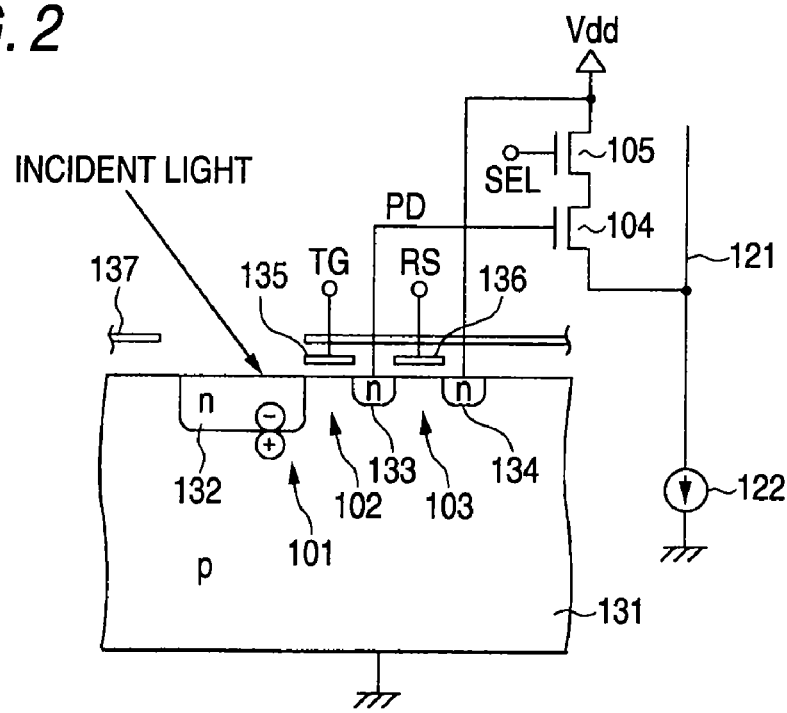
FIG. 2 is a cross-sectional view showing the cross-sectional structure of main portions of a pixel portion.

In the blackening detection circuit 23A, the signal voltage Vx is supplied from the unit pixel 11 to the input terminal 41 through the column signal line. The predetermined reference voltage Vs is supplied to the control terminal 42. A reset signal PSET is supplied to the control terminal 33 and a latch signal LATCH is supplied from the timing control circuit 26 (see FIG. 2) to the control terminal 34.

The source electrode of the MOS transistor 41 is connected to a power source potential Vdd and the gate electrode thereof is connected to the control terminal 33. The MOS transistor 43 is a detection transistor of which the drain electrode is connected to the drain electrode of the MOS transistor 41 and the gate electrode is connected to the control terminal 42. The drain electrode of the MOS transistor 44 is connected to the source electrode of the MOS transistor 43, the source electrode thereof is connected to the input terminal 31, and the gate electrode thereof is connected to the control terminal 33.

The capacitor 46 is, for example, a MOS capacitor and connected between the source electrode and the drain electrode of the MOS transistor 41. The MOS transistor 42 is a buffer transistor of which the drain electrode is connected to the source electrode of the MOS transistor 41 and the gate electrode is connected to the drain electrode of the MOS transistor 43 (the drain electrode of the MOS transistor 41). The drain electrode and the gate electrode of the MOS transistor 45 are commonly connected to the drain electrode of the MOS transistor 42 in the diode connection and the source electrode thereof is grounded.

One end of the switch 47 is connected to the drain electrode of the MOS transistor 42 (the drain electrode and the gate electrode of the MOS transistor 45) and is turned on/off (closing/opening) by the latch signal LATCH input through the control terminal 34. The switch 48 is connected between the other end of the switch 47 and the output terminal 35 and turned on/off by the latch signal LATCH which is input through the control terminal 34 and inverted by the inverter 49. The inverters 50 and 51 are connected between the other end of the switch 47 and the output terminal 35 in series.

In the blackening detection circuit 23A configured above, the blackening detection circuit 23A is formed on the same semiconductor chip as the pixel array portion 12 and the MOS transistor 43 has the substantially same transistor characteristics as the amplifying transistor 114 of the unit pixel 11. The source electrode of the MOS transistor 43 which is the detection transistor is commonly connected to the amplifying transistor 114 which is the output transistor of the unit pixel 11 through the column signal line 14 and the common connection node is connected to the MOS transistor 272 as the current source, thereby configuring a differential circuit. The MOS transistor 44 is interposed between the MOS transistor 43 and the column signal line 14 and the selection transistor 115 is interposed between the amplifying transistor 114 and the column signal line 14. Such transistors 44 and 115 have the substantially same transistor characteristics.

The five MOS transistors 41 to 45 and one capacitor 46 compare the signal voltage Vx of the column signal line 14 (14-1 to 14-m) according to the potential Vfd of the FD portion of the unit pixel 11 with the reference voltage Vs to configure a detection circuit 52 having a comparator for detecting the generation of the blackening phenomenon. The detailed circuit operation will be described later. The switches 47 and 48 and the inverters 49 to 51 configure the latch circuit 53 for maintaining the detected result of the detection circuit 52 during a period 1H (H is a horizontal period).

When the MOS transistor 43 and the amplifying transistor 114 have the substantially same transistor characteristics, the MOS transistor 44 and the selection transistor 115 have the substantially same transistor characteristics, and the MOS transistor 43 and the amplifying transistor 114 configure the differential circuit, the transistor characteristics of the transistors 43, 44, 114 and 115 can be offset and, as a result, the irregularity of the transistor characteristics and more particularly the irregularity of a threshold voltage Vth can be eliminated.

More specifically, the source electrode of the MOS transistor 43 and the source electrode of the amplifying transistor 114 are commonly connected through the column signal line 14 and, as a result, the transistors 43 and 114 have the same the source potential. At this time, since the MOS transistor 43 and the amplifying transistor 114 have the substantially same transistor characteristics, the threshold voltages Vth of the both transistors 43 and 114 according to substrate bias effect vary equally and thus the variations are offset by the differential operation between the MOS transistor 43 and the amplifying transistor 114. The same is true in the MOS transistor 44 and the selection transistor 115.

Figure 12:
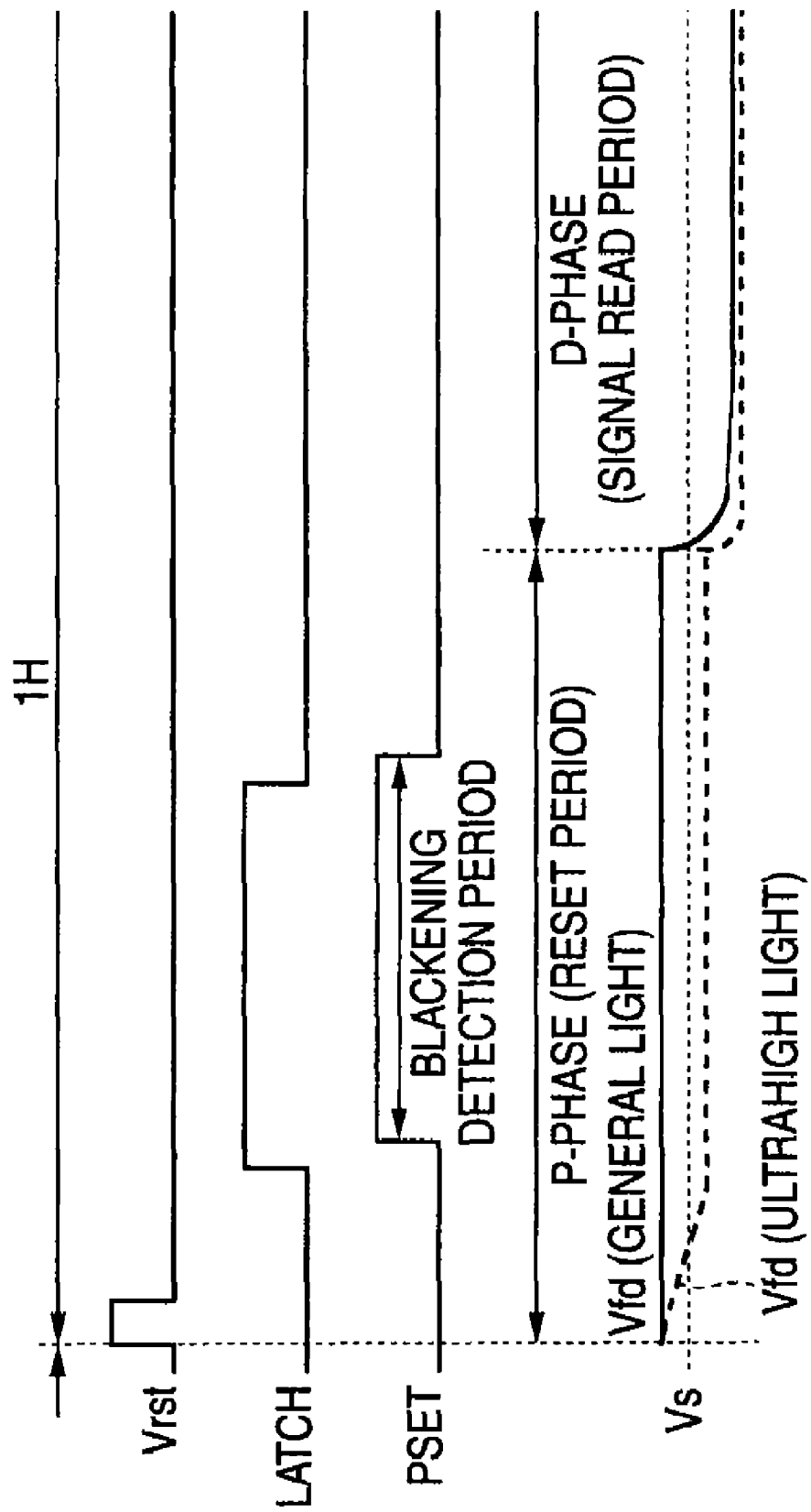
FIG. 12 is a timing chart showing the operation of the blackening detection circuit according to the first circuit example.

Next, the circuit operation of the blackening detection circuit 23A configured above will be described with reference to the timing chart of FIG. 12. In FIG. 12, a reference numeral Vrst denotes a reset signal applied to the gate electrode of the reset transistor 113 of the unit pixel 11.

Until a blackening detection period in which the reset signal PSET is in the active state ("H" level/Vdd level) starts, that is, in the period that the reset signal PSET is in the inactive state ("L" level/GND level), the MOS transistor 41 is in an ON (conductive) state and the MOS transistor 44 is an OFF (non-conductive) state. When the MOS transistor 41 is in the ON state, charge according to the power supply voltage Vdd is charged in the gate capacitance of the MOS transistor 42 and the capacitor 46 through the MOS transistor 41. At this time, since the MOS transistor 42 is in the OFF state, the source potential of the MOS transistor 42 is in the "L" level.

In the blackening detection period, the MOS transistor 41 is in the OFF state and the MOS transistor 44 is in the ON state. At this time, since the reference voltage Vs is applied to the gate electrode of the MOS transistor 43, the MOS transistor 43 is turned on when the gate-source voltage Vgs is equal to or larger than the threshold voltage Vth. Then, the charge is discharged from the gate capacitance of the MOS transistor 42 and the capacitor 46 through the MOS transistor 43.

When the gate potential of the MOS transistor 42 drops by the discharge and becomes smaller than the threshold voltage Vth, the MOS transistor 42 is turned on and the source potential of the MOS transistor 42 becomes the "H" level. In the present blackening detection circuit 23A, the detection sensitivity of the circuit is determined by the capacitance value of the gate node of the MOS transistor 42.

For example, it is assumed that the gate potential of the amplifying transistor 114 of a general P-phase state for reading the reset level is, for example, 2.7 V and the gate potential of the amplifying transistor 114 of the P-phase state is changed to 2.5 V by the blackening phenomenon. At this time, when the reference voltage Vs is set to 2.6 V, the MOS transistor 43 is turned on and thus the charge is discharged from the gate capacitance of the MOS transistor 42 and the capacitor 46 through the MOS transistor 43.

When the gate potential of the MOS transistor 42 drops and the MOS transistor 42 is turned on, the source potential of the MOS transistor 42, that is, the output of the detection circuit 52, becomes the "H" level and the blackening phenomenon is detected. Meanwhile, when the gate potential of the amplifying transistor 114 is 2.7 V, the MOS transistor 43 is not turned on and thus the source potential of the MOS transistor 42, that is, the output of the detection circuit 52, remains the "L" level.

The output of the detection circuit 52 at the time of the blackening detection, that is, the source potential of the MOS transistor 42 having the "H" level is maintained during the period 1H by the latch circuit 53 and is output as a blackening detection signal SUNOUT. The blackening detection signal SUNOUT is supplied to the buffer circuit 21 provided at the next stage of the comparator 20 of FIG. 9.

When the detection sensitivity of the blackening detection circuit 23A is excessively high, the capacitance value of the gate capacitance of the MOS transistor 42 which is the buffer transistor, and more particularly, the capacitance value of the capacitor 46, is property changed to adjust the detection sensitivity.

Figure 13:
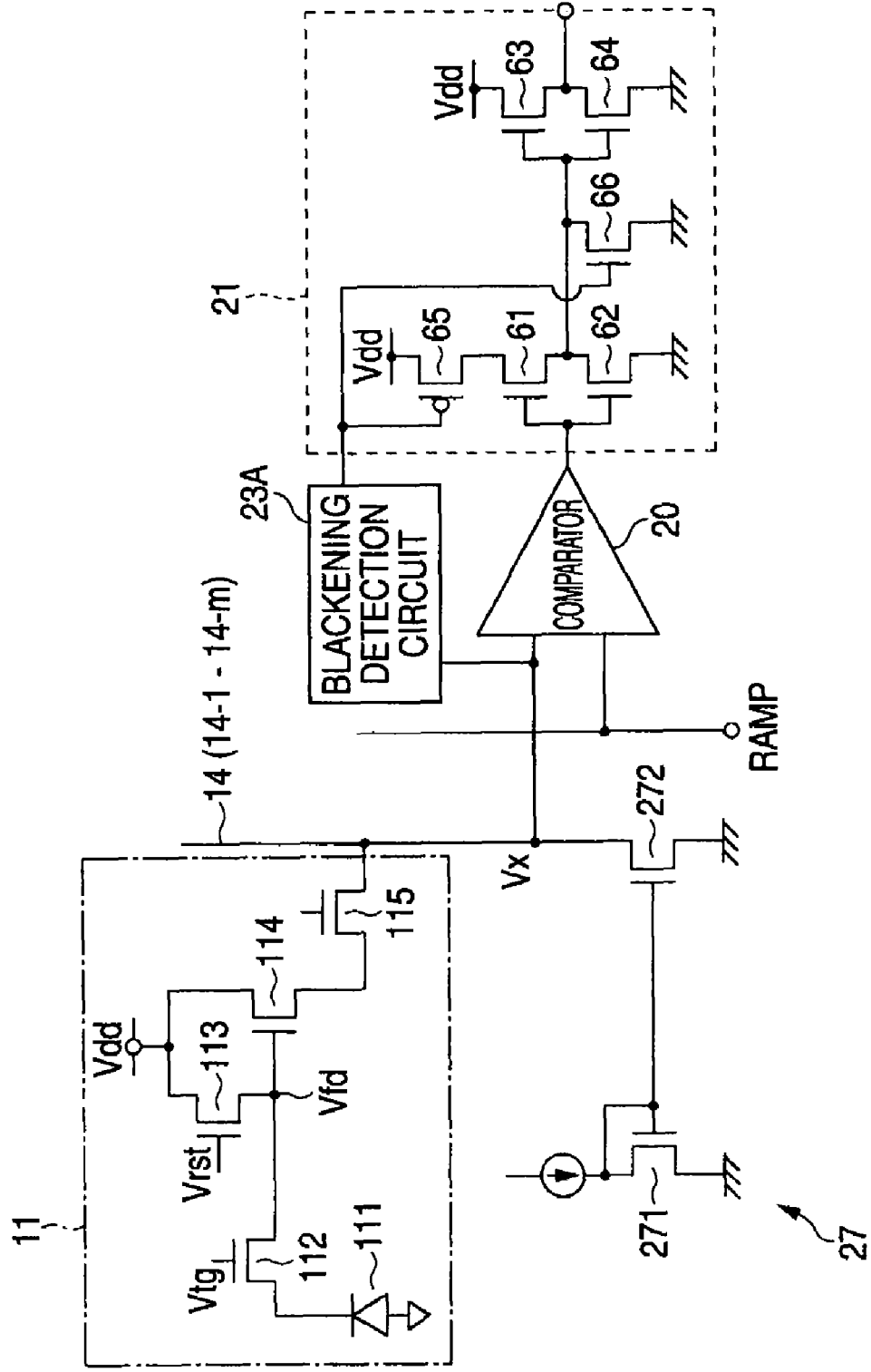
FIG. 13 is a circuit diagram showing a circuit example of a buffer circuit.

FIG. 13 shows a circuit diagram showing a circuit example of the buffer circuit 21. As shown in FIG. 13, the buffer circuit 21 according to the present example includes a first inverter including a p-channel type MOS transistor 61 and an n-channel type MOS transistor 62 of which the gate electrodes and the drain electrodes are commonly connected, respectively, and a second inverter including a p-channel type MOS transistor 63 and an n-channel type MOS transistor 64 of which the gate electrodes and the drain electrodes are commonly connected, respectively. The first inverter and the second inverter are connected in cascade.

A P-channel type MOS transistor 65 is connected between the source electrode of the p-channel type MOS transistor 61 and the power source potential Vdd and an n-channel type MOS transistor 66 is connected between the input node of the second inverter (the output node of the first inverter) and ground.

In the buffer circuit 21 configured above, when the blackening phenomenon is not detected by the blackening detection circuit 23A, the "L" level is output from the blackening detection circuit 23A, the p-channel type MOS transistor 65 is turned on and the n-channel type MOS transistor 66 is turned off. Thus, the output Vco of the comparator 20 is inverted by the first inverter and the second inverter and externally output.

When the blackening phenomenon is detected by the blackening detection circuit 23A, the blackening detection signal SUNOUT having the "H" level is output from the blackening detection circuit 23A, the p-channel type MOS transistor 65 is turned off, the first inverter falls into the inactive state, the n-channel type MOS transistor 66 is turned on, and the input node of the second inverter is fixed to a GND level. As a result, the output of the buffer circuit 21 is fixed to the "H" level.

Figure 14:
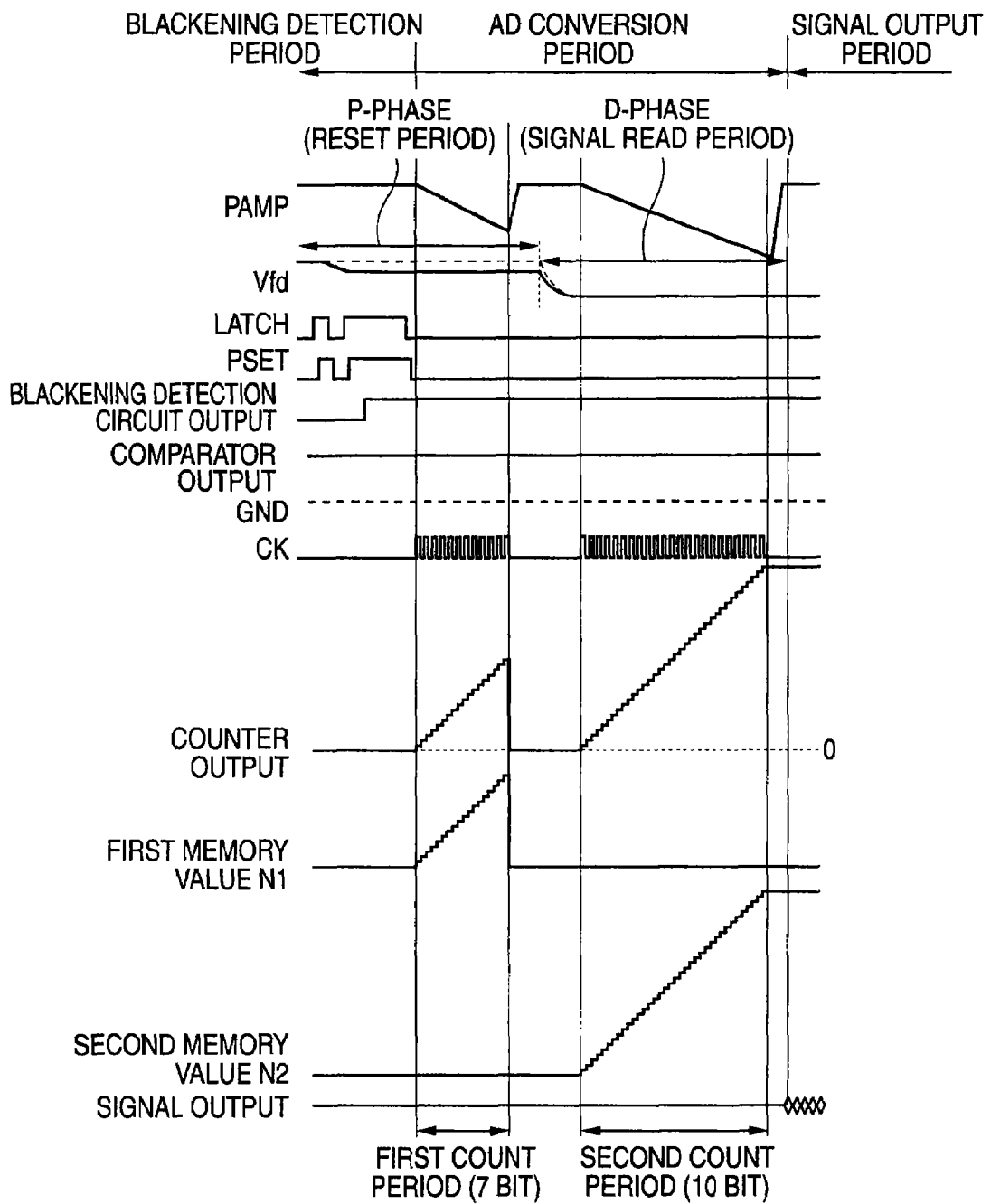
FIG. 14 is a timing chart showing the operation at the time of blackening detection in the solid-state image pickup device having the column-parallel ADC mounted thereon.

Next, the blackening detection operation of the solid-state image pickup device having the column-parallel ADC mounted thereon will be described with reference to the timing chart of FIG. 14. FIG. 14 shows the waveform and the timing relationship of the reference voltage RAMP, the potential Vfd of the FD portion of the unit pixel 11, the latch signal LATCH, the reset signal PSET, the output of the blackening detection circuit 23, the output of the comparator 20, the clock signal CK, the output (count value) of the counter 19, the first memory value N1 and the second memory value N2 stored in the memory device 22, and the signal output.

In an actual operation, before performing the main detection operation of the blackening phenomenon, the latch signal LATCH is set to the "H" level (active) and the reset signal PSET is set to the "H" level such that a temporary detection operation is performed as the reset operation of the blackening detection circuit 23A (period A of FIG. 14). The reason why the temporary detection operation is performed is as follows:

That is, in the blackening detection circuit 23A of FIG. 11, since the MOS transistor 45 is diode-connected and the drain potential of the MOS transistor 45 is in the GND level or the threshold voltage Vth of the MOS transistor 45 is fixed by the previous operation, the temporary detection operation is performed before performing the main detection operation of the blackening phenomenon such that the reset state of the blackening detection circuit 23A is matched for each column.

After performing the temporary detection operation for reset, the main detection operation for detecting the blackening phenomenon is performed by the blacking detection circuit 23A. When the blackening phenomenon occurs, the blackening detection circuit 23A outputs the blackening detection signal SUNOUT having the "H" level. Accordingly, the buffer circuit 21 fixes the comparison output Vco of the comparator 20 to the "H" level, that is, the logic state before the comparison operation starts.

The fixing of the comparison output Vco of the comparator 20 to the "H" level means that the trigger for transmitting the count value of the counter 19 is not supplied from the comparator 20 to the memory device 22. Accordingly, the counter 19 continuously performs the count operation until the supply of the clock signal CK stops and the count value reaches a full count value. Accordingly, the memory device 22 receives and maintains the full count value of the counter 19 regardless of the comparison time of the comparator 20, whether the P-phase state (first read period/reset period) or the D-phase state (second read period/signal read period).

The full count value of the counter 19 in the P-phase state and the D-phase state becomes a white signal level after the CDS process of the signal processing circuit 26. Accordingly, even if the significantly strong light such as solar light enters the unit pixel 11, the signal level after the CDS process becomes the white signal level and, as a result, the blackening phenomenon in which a brightest portion blackens can be avoided.

SECOND CIRCUIT EXAMPLE

Figure 15:
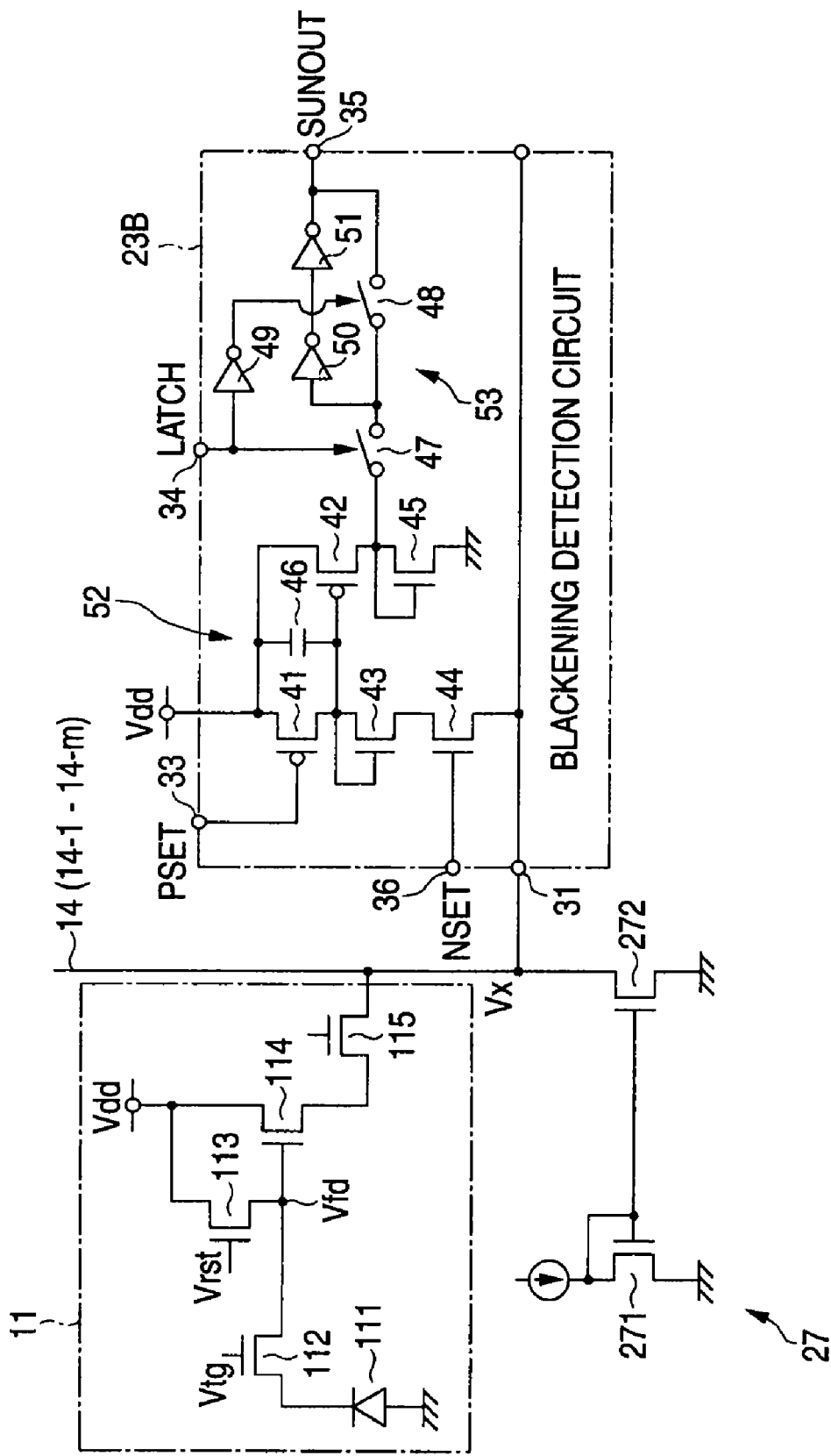
FIG. 15 is a circuit diagram showing the configuration of a blackening detection circuit according to a second circuit example.

FIG. 15 is a circuit diagram showing the configuration of a blackening detection circuit 23B according to a second circuit example. In FIG. 15, the same portions as FIG. 11 are denoted by the same reference numerals.

Figure 3:
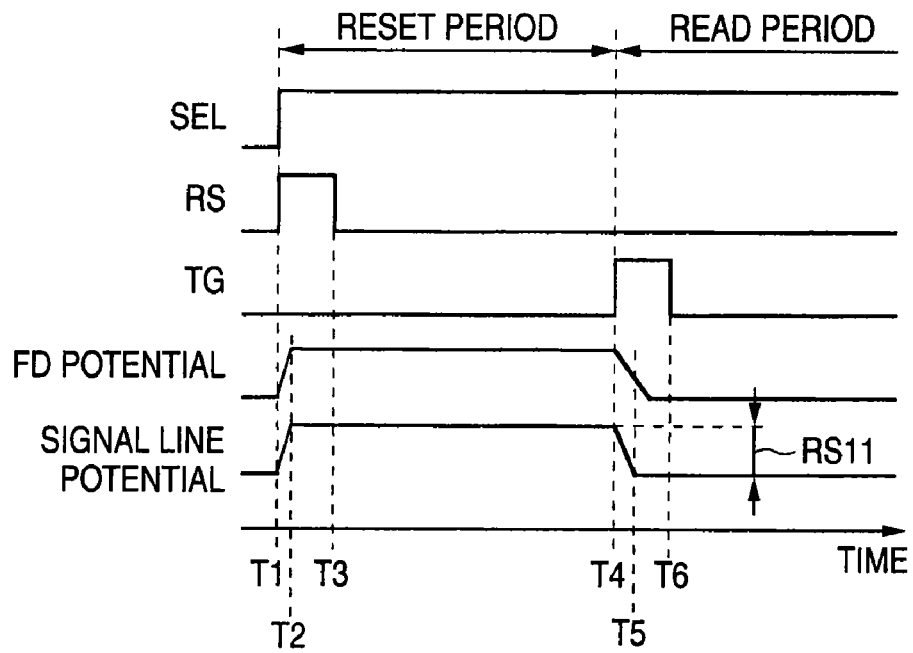
FIG. 3 is a waveform diagram showing the circuit operation of a pixel.
Figure 4:
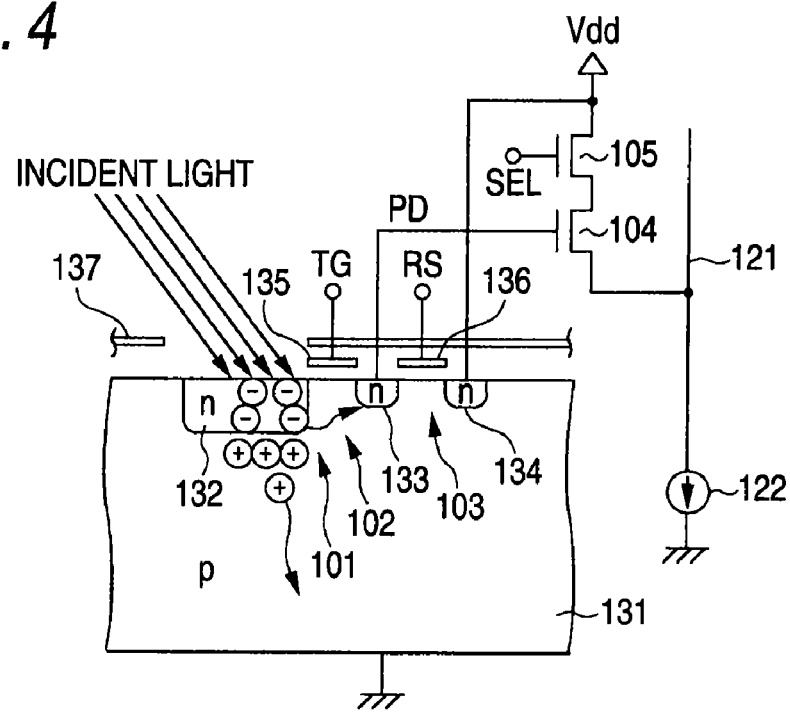
FIG. 4 is a schematic diagram showing the generation mechanism of a blackening phenomenon.
Figure 5:
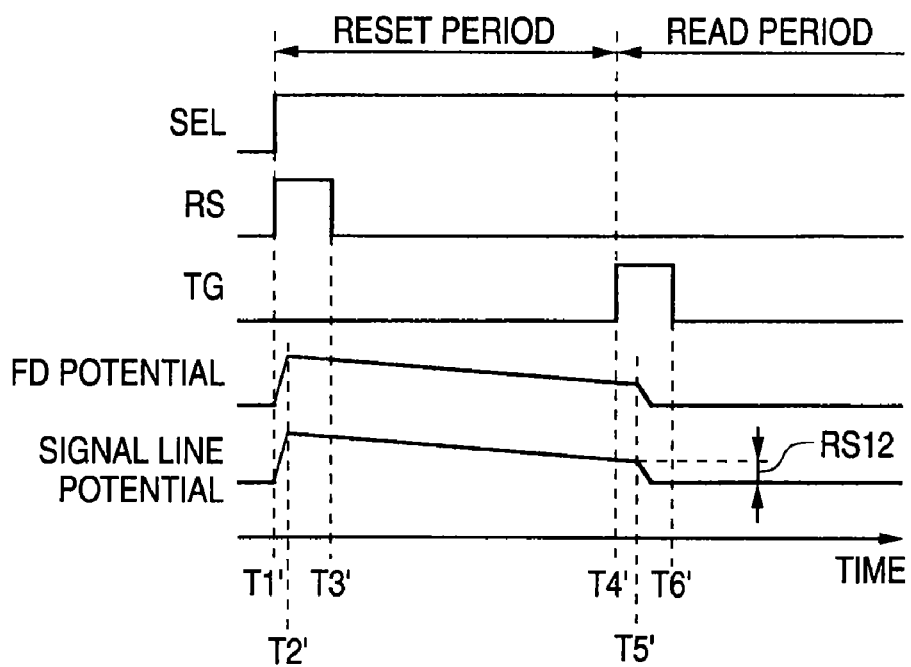
FIG. 5 is a waveform diagram at the time of the blackening phenomenon.
Figure 6:
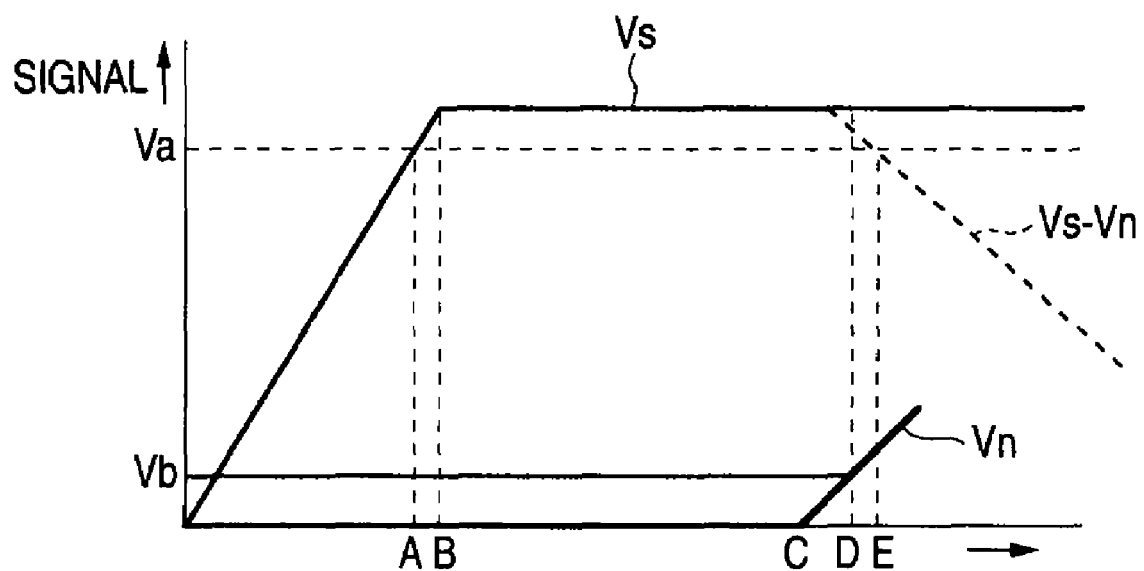
FIG. 6 is a view showing the generation mechanism of the blackening phenomenon.

In the blackening detection circuit 23B according to the second circuit example, the gate electrode and the drain electrode of a MOS transistor 43 are commonly connected in a diode connection and the reference voltage Vs is not supplied to the gate electrode of the MOS transistor 43. A reset signal NSET different from the reset signal PSET is supplied to the gate electrode of the MOS transistor 44 through the control terminal 36. The other circuit configuration is basically similar to that of FIG. 3.

Figure 16:
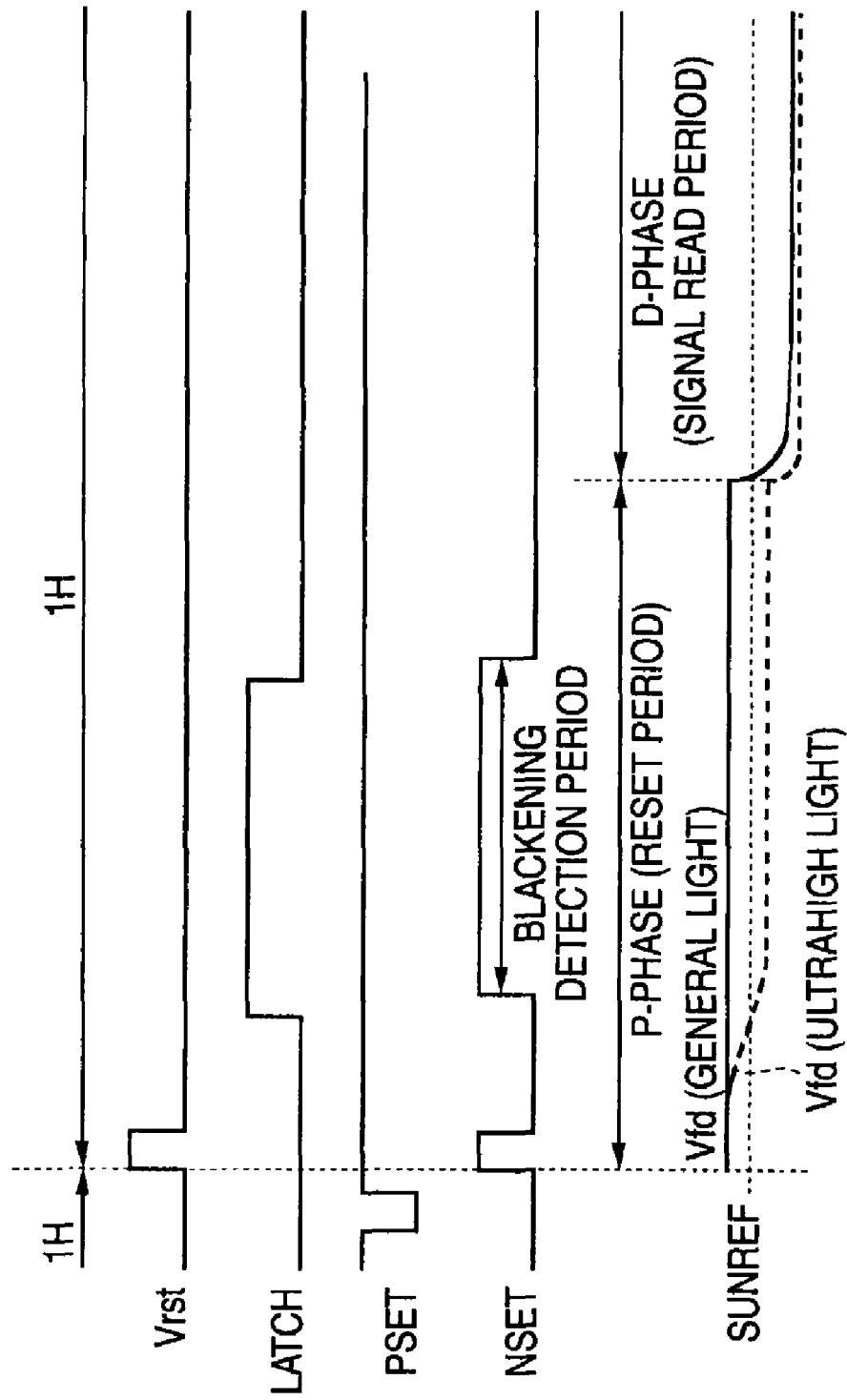
FIG. 16 is a timing chart showing the operation of the blackening detection circuit according to the second circuit example.

FIG. 16 is a timing chart showing the operation of the blackening detection circuit 23B. As shown in FIG. 16, the reset signal PSET is a pulse signal which is in the inactive state ("H" level) during most of the period 1H and transitions to the active state ("L" level) just before the period 1H is finished. The reset signal NSET is a pulse signal which transitions to the active state ("H" level) in synchronization with the reset signal Vrst supplied to the gate electrode of the reset transistor 113 of the unit pixel 11 at the time of start-up of the period 1H, transitions to the inactive state once, and transitions to the active state again in the P-phase period.

At the end of the previous read, that is, just before the previous period 1H is finished, the reset signal PSET transitions to the "L" level and the MOS transistor 41 is turned on. Thus, the charge is charged to the gate capacitance of the MOS transistor 42 and the capacitor 46 through the MOS transistor 41 by the power supply voltage Vdd.

At the time of the start-up of the period 1H, that is, at the beginning of the P-phase period, the reset signal NSET transitions to the "H" level and the MOS transistor 44 is turned on once. At this time, the charge is charged to the gate capacitance of the MOS transistor 42 and the capacitor 46 by the voltage Vx+Vth obtained by adding the signal voltage Vx of the column signal line 14 and the threshold voltage Vth of the MOS transistor 43.

Thereafter, the reset signal NSET transitions to the "L" level once and then transitions to the "H" level once more in the P-phase period. Accordingly, the MOS transistor 44 is turned off once and then turned on again in the P-phase state. At this time, when the signal voltage Vx of the column signal line 14 drops by the voltage obtained by adding the threshold voltage Vth of the MOS transistor 43 and the voltage Vx+Vth when the MOS transistor 44 is primarily turned on, the MOS transistor 43 is turned on and thus the charge is discharged from the gate capacitance of the MOS transistor 42 and the capacitor 46.

When the gate potential of the MOS transistor 42 drops by the discharge and decreases to less than the threshold voltage Vth, the MOS transistor 42 is turned on and thus the source potential of the MOS transistor 42, that is, the output of the detection circuit 52 transitions to the "H" level.

Meanwhile, if the signal voltage Vx of the column signal line 14 when the MOS transistor 44 is secondarily turned on is not substantially changed from that of when the MOS transistor 44 is primarily turned on, and more specifically, if the signal voltage Vx is equal to or less than the threshold voltage Vth of the MOS transistor 43, the source potential of the MOS transistor 42, that is, the output of the detection circuit remains the "L" level.

The output of the detection circuit at the time of the blackening detection, that is, the source potential of the MOS transistor 42 having the "H" level is maintained during the period 1H by the latch circuit 53 and is then output as the blackening detection signal SUNOUT. The blackening detection signal SUNOUT is supplied to the buffer circuit 21 provided at the next stage of the comparator 20 of FIG. 9.

The blackening detection circuit 23B according to the circuit example 2 can realize the equivalent detection operation only by the timing control without using the reference voltage Vs, compared with the blackening detection circuit 23A according to the first circuit example. Since the reference voltage Vs is not necessary, the configuration of the power source circuit for generating the voltage having various values can be simplified compared with the blackening detection circuit 23A according to the first circuit example.

Since the blackening detection circuits 23A and 23B according to the first and second circuit examples have very simple circuit configurations including the detection circuit 52 having five MOS transistors 41 to 45 and one capacitor 46 and the latch circuit 53 having two switches 47 and 48 and three inverters 49 to 51 and the comparison output Vco of the comparator 20 is output without alteration or the comparison output Vco of the comparator 20 is fixed to the state before the comparison starts, based on the detection outputs of the blackening detection circuits 23A and 23B, the circuit for avoiding the blackening phenomenon can be accomplished by the small-sized circuit configuration.

Since the circuit for avoiding the blackening phenomenon can be accomplished by the small-sized circuit configuration, like the solid-state image pickup device having the column-parallel ADC mounted thereon by arranging the ADC 16 (16-1 to 16-m) for each column, even if the layout area is restricted when the circuit for avoiding the blackening phenomenon is arranged for each column, the circuit for avoiding the blackening phenomenon can be arranged in the restriction and, as a result, a solid-state image pickup device having the column-parallel ADC mounted thereon, which can avoid the blackening phenomenon generated when significant strong light such as solar light enters, can be accomplished.

In the blackening detection circuits 23A and 23B according to the first and second circuit examples, the MOS transistor 43 of the input stage and the amplifying transistor 114 connected thereto through the column signal line 14 configure the differential circuit. Accordingly, when the transistors 43 and 114 have the substantially same transistor characteristics, the variations of the threshold voltages Vth thereof are cancelled and, as a result, a circuit operation which is hard to depend on the irregularity of the threshold voltage Vth can be accomplished.

In accordance with the circuit operation which is hard to depend on the irregularity of the threshold voltage Vth, large effect can be obtained in the solid-state image pickup device having the column-parallel ADC mounted thereon. That is, since the variations of the threshold voltages Vth are cancelled for each column and the circuit operation which is hard to depend on the irregularity of the threshold voltage Vth can be accomplished, the signal level for each column is not influenced by the irregularity of the threshold voltage Vth even if the irregularity occurs in the threshold voltage Vth of the amplifying transistor 114 of the unit pixel 11 for each column. Thus, irregularity does not occur in the detection level for each column.

Although the blackening phenomenon is detected by the blackening detection circuit 23 (23A and 23B) at the beginning of the P-phase period for reading the reset level of the unit pixel 11 in the above-described embodiment, the blackening phenomenon may be detected between the P-phase period and the D-phase period.

Figure 7:
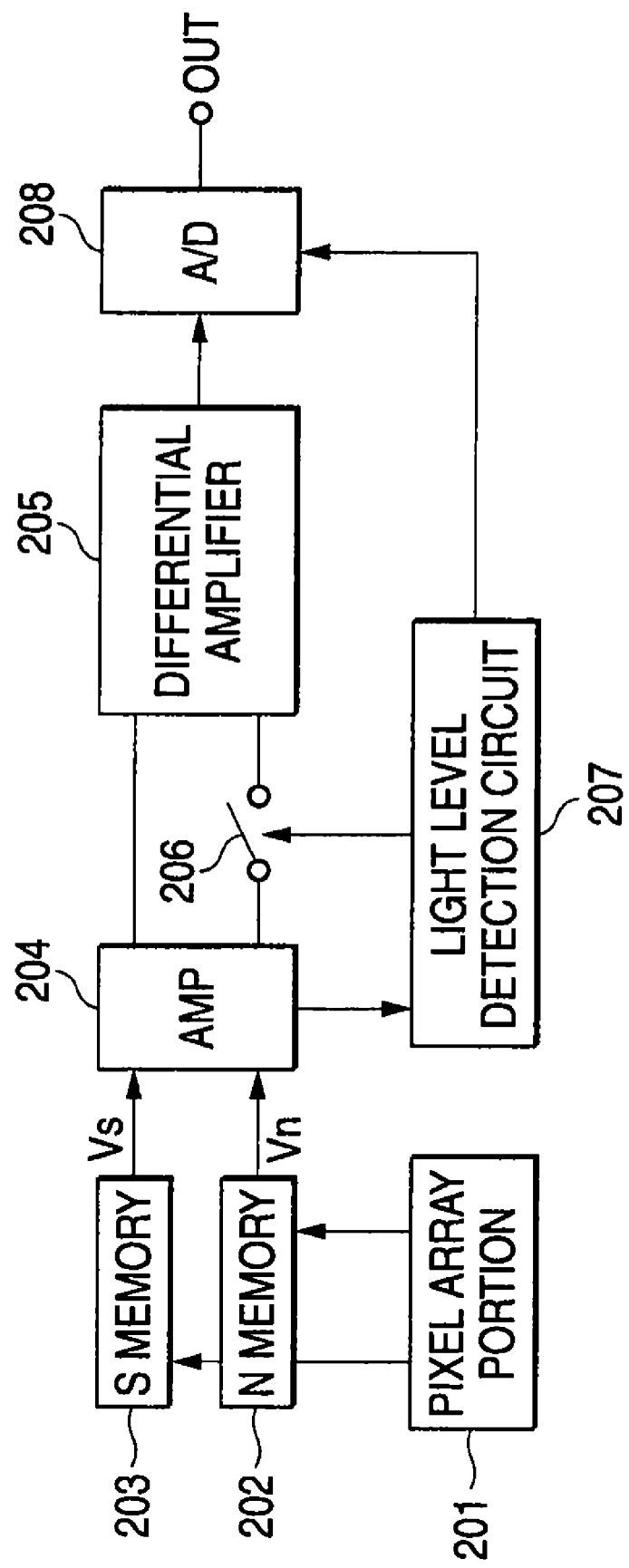
FIG. 7 is a block diagram showing a known technology.
Figure 8:
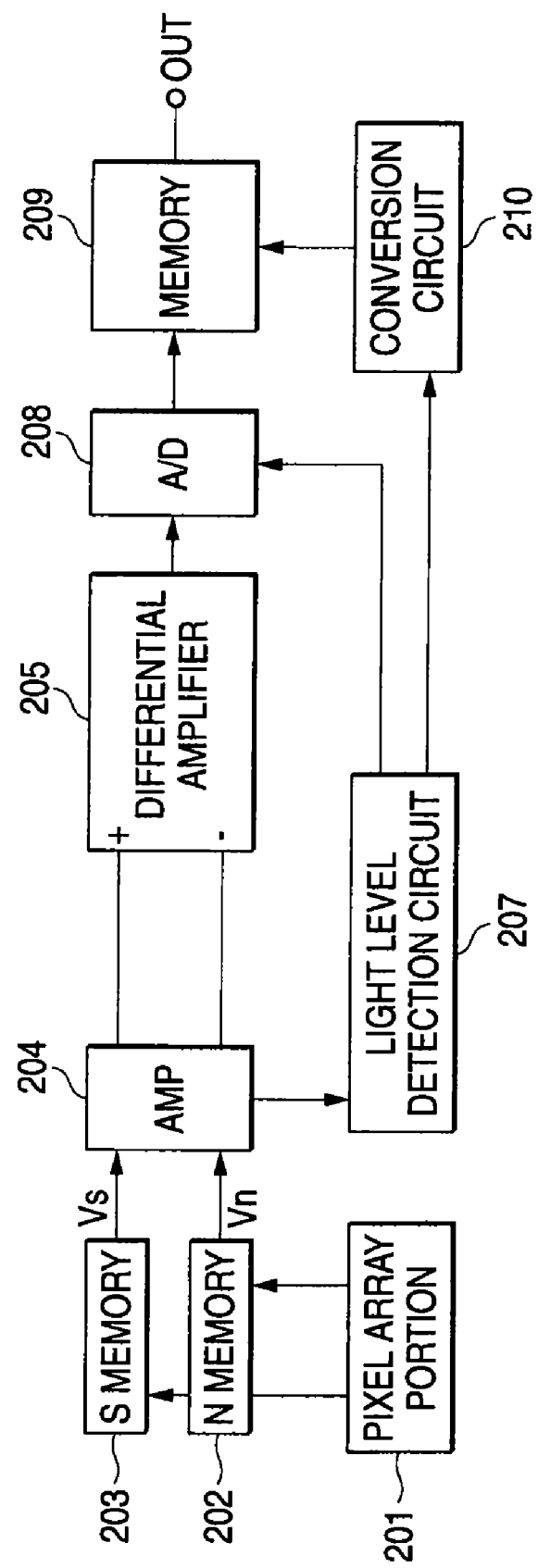
FIG. 8 is a block diagram showing another known technology.

Although the solid-state image pickup device having the column-parallel ADC mounted thereon is, for example, described in the above-described embodiment, the present invention is not limited thereto and is applicable to the solid-state image pickup device shown in FIG. 7 or 8.

Although the counter 19 is commonly provided in the ADCs 16-1 to 16-m using the up counter in the above-described embodiment, an up/down counter may be provided for each of the ADCs 16-1 to 16-m as the counter 19. When the up/down counter is used as the counter 19, it is possible to realize a CDS process for obtaining the difference between the signal level of the D-phase state and the reset level of the P-phase state in each of the ADCs 16-1 to 16-m.

APPLICATION EXAMPLE

The solid-state image pickup device 10 having the column-parallel ADC mounted thereon according to the above-described embodiment can be suitably used as an image pickup device (image input device) in an imaging apparatus such as a camera module for a mobile apparatus such as a mobile telephone in addition to a video camera or a digital still camera.

Figure 17:
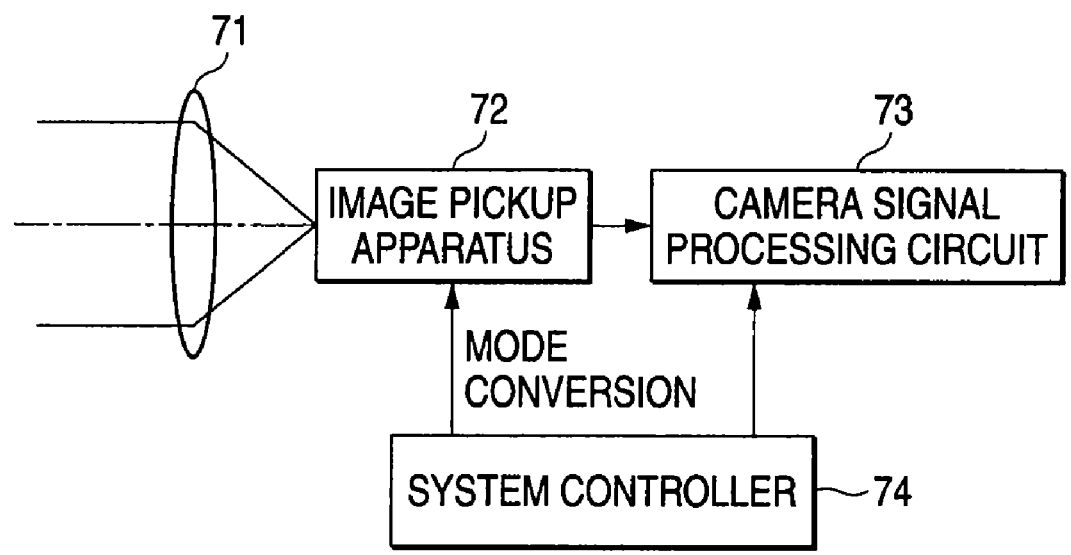
FIG. 17 is a block diagram showing the configuration of an imaging apparatus according to an embodiment of the present invention.

FIG. 17 is a block diagram showing the configuration of an imaging apparatus according to an embodiment of the present invention. As shown in FIG. 17, the imaging apparatus according to the example includes an optical system including a lens 71, an image pickup device 72, a camera signal processing circuit 73 and a system controller 74.

The lens 71 forms image light from a subject onto an image pickup surface of the image pickup device 72. The image pickup device 72 outputs an image signal which is obtained by converting the image light formed on the image pickup surface by the lens 71 into an electrical signal in the unit pixel. As the image pickup device 72, the solid-state image pickup device 10 having the column-parallel ADC mounted thereon according to the above-described embodiment is used.

The camera signal processing circuit 73 performs various signal processes on the image signal output from the image pickup device 72. The system controller 74 controls the image pickup device 72 or the camera signal processing circuit 73. Particularly, when the column-parallel ADC of the image pickup device 72 can perform the AD conversion operations corresponding to operation modes such as a general frame rate mode in a progressive scanning method for reading information on all the pixels and a high-speed frame rate mode which can increase the frame rate to n times by setting an exposure time of the pixel to 1/N compared with the general frame rate mode, the switching of the operation modes can be controlled according to an external instruction.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
 a pixel array portion which includes a plurality of unit pixels each having a photoelectric conversion element and an output transistor for outputting a signal according to charge obtained by photoelectric conversion of the photoelectric conversion element;
 a comparing portion which compares the signal output from each of the unit pixels with a ramp-shaped reference signal;
 a measuring portion which starts an operation in synchronization with the supply of the reference signal to the comparing portion, performs the operation until the comparison output of the comparing portion is inverted, and measures a time during which the comparison occurs; and
 a detecting portion which detects a predetermined image pickup condition and fixes the comparison output of the comparing portion to a state before the comparison starts when the image pickup condition is detected.

2. The solid-state image pickup device according to claim 1, wherein the detecting portion has a detection transistor which detects the image pickup condition in which a reset level output from each of the unit pixels is equal to or less than a predetermined reference level when the unit pixel is reset.

3. The solid-state image pickup device according to claim 2, wherein the detection transistor and the output transistor of each of the unit pixels configure a differential circuit.

4. The solid-state image pickup device according to claim 2, wherein the detecting portion has a buffer transistor of which the gate electrode is connected to the drain electrode of the detection transistor and the gate capacitance is charged to a power source potential before the detection of the detection transistor, and detection sensitivity is adjustable by the capacitance value of the gate capacitance of the buffer transistor.

5. A method of driving a solid-state image pickup device including a pixel array portion which includes a plurality of unit pixels each having a photoelectric conversion element and an output transistor for outputting a signal according to charge obtained by photoelectric conversion of the photoelectric conversion element, a comparing portion which compares the signal output from each of the unit pixels with a ramp-shaped reference signal, and a measuring portion which starts an operation in synchronization with the supply of the reference signal to the comparing portion, performs the operation until the comparison output of the comparing portion is inverted, and measures a time during which the comparison occurs, the method comprising the steps of:
 detecting a predetermined image pickup condition; and
 fixing the comparison output of the comparing portion to a state before the comparison starts when the image pickup condition is detected.

6. A solid-state image pickup device comprising:
 a pixel array portion in which unit pixels each having a photoelectric conversion element and an output transistor for outputting a signal according to charge obtained by photoelectric conversion of the photoelectric conversion element are two-dimensionally arranged in a matrix; and
 analog-digital converting portions which are arranged in the matrix-shaped the unit pixel array for each column and converts an analog signal output from each of the unit pixel into a digital signal,
 wherein each of the analog-digital converting portions includes
  a comparing portion which compares the signal output from each of the unit pixels with a ramp-shaped reference signal,
  a measuring portion which starts an operation in synchronization with the supply of the reference signal to the comparing portion, performs the operation until the comparison output of the comparing portion is inverted, and measures a time during which the comparison occurs and a detecting portion which detects a predetermined image pickup condition in which a reset level output from each of the unit pixels is equal to or less than a predetermined reference level when the unit pixel is reset and fixes the comparison output of the comparing portion to a state before the comparison starts when the image pickup condition is detected.

7. An imaging apparatus comprising:

a solid-state image pickup device;

an optical system which forms image light from a subject on an image pickup surface of the solid-state image pickup device, wherein the solid-state image pickup device includes a pixel array portion which includes a plurality of unit pixels each having a photoelectric conversion element and an output transistor for outputting a signal according to charge obtained by photoelectric conversion of the photoelectric conversion element, a comparing portion which compares the signal output from each of the unit pixels with a ramp-shaped reference signal, a measuring portion which staffs an operation in synchronization with the supply of the reference signal to the comparing portion, performs the operation until the comparison output of the comparing portion is inverted, and measures a time during which the comparison occurs, and a detecting portion which detects a predetermined image condition and fixes the comparison output of the comparing portion to a state before the comparison starts when the image pickup condition is detected.

* * * * *